United States Patent
Jung et al.

(10) Patent No.: US 10,392,702 B2
(45) Date of Patent: Aug. 27, 2019

(54) SUBSTRATE PROCESSING APPARATUS

(71) Applicant: EUGENE TECHNOLOGY CO., LTD., Yongin-Si, Gyeonggi-Do (KR)

(72) Inventors: Woo Duck Jung, Suwon-Si (KR); Kyu Jin Choi, Yongin-Si (KR); Song Hwan Park, Yongin-Si (KR); Seong Min Han, Yongin-si (KR); Sung Ha Choi, Yongin-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 300 days.

(21) Appl. No.: 15/214,441

(22) Filed: Jul. 19, 2016

(65) Prior Publication Data

US 2017/0025293 A1 Jan. 26, 2017

(30) Foreign Application Priority Data

Jul. 20, 2015 (KR) .................. 10-2015-0102391

(51) Int. Cl.
*H01L 21/673* (2006.01)
*C23C 16/455* (2006.01)
*C23C 16/44* (2006.01)
*H01L 21/67* (2006.01)

(52) U.S. Cl.
CPC .... *C23C 16/45563* (2013.01); *C23C 16/4412* (2013.01); *C23C 16/45504* (2013.01); *H01L 21/67109* (2013.01); *H01L 21/67303* (2013.01); *H01L 21/67309* (2013.01)

(58) Field of Classification Search
CPC .................................................. H01L 2/67309
See application file for complete search history.

(56) References Cited

U.S. PATENT DOCUMENTS

| | | | |
|---|---|---|---|
| 4,062,318 A | 12/1977 | Ban et al. | |
| 2002/0092815 A1* | 7/2002 | Kim | C30B 31/14 211/41.18 |
| 2009/0004405 A1* | 1/2009 | Merry | C23C 16/4586 427/585 |
| 2009/0197424 A1* | 8/2009 | Sakai | C23C 16/405 438/758 |
| 2010/0154711 A1* | 6/2010 | Ishibashi | C23C 16/45502 118/725 |

FOREIGN PATENT DOCUMENTS

| | | |
|---|---|---|
| CN | 1701417 A | 11/2005 |
| CN | 101288157 A | 10/2008 |
| CN | 102330072 A | 1/2012 |
| JP | 2004304128 A | 10/2004 |
| JP | 2007109711 A | 4/2007 |

(Continued)

*Primary Examiner* — Joseph A Miller, Jr.
(74) *Attorney, Agent, or Firm* — Renaissance IP Law Group LLP

(57) ABSTRACT

Provided is a substrate processing apparatus, and more particularly, a batch-type substrate processing apparatus where processes can be performed independently on a plurality of substrates. The substrate processing apparatus includes a substrate boat including a plurality of partition plates and a plurality of connection rods, an internal reaction tube, a gas supply unit, and an exhaust unit, and a plurality of substrates are loaded to be separated from the partition plates.

11 Claims, 4 Drawing Sheets

(56) References Cited

FOREIGN PATENT DOCUMENTS

| | | |
|---|---|---|
| JP | 200916832 A | 1/2009 |
| JP | 2009194184 A | 8/2009 |
| KR | 20110018566 A | 2/2011 |
| KR | 101313262 B1 | 9/2013 |
| KR | 20140090839 A | 7/2014 |
| KR | 101431087 B1 | 8/2014 |
| KR | 20140006404 U | 12/2014 |
| KR | 20150045012 | 4/2015 |
| TW | 201508829 A | 3/2015 |

* cited by examiner (a)  (b)

SUBSTRATE PROCESSING APPARATUS

CROSS-REFERENCE TO RELATED PATENT APPLICATION

This application claims the benefit of Korean Patent Application No. 10-2015-0102391, filed on Jul. 20, 2015, in the Korean Intellectual Property Office, the disclosure of which is incorporated herein in its entirety by reference.

BACKGROUND OF THE INVENTION

1. Field of the Invention

The present invention relates to a substrate processing apparatus, and more particularly, to a batch-type substrate processing apparatus where processes can be performed independently on a plurality of substrates.

2. Description of the Prior Art

In general, as a substrate processing apparatus, there are a single wafer type substrate processing apparatus where substrate processes can be performed on a single substrate and a batch type substrate processing apparatus where substrate processes can be performed simultaneously on a plurality of substrates. The single wafer type has an advantage in terms of simple configuration but has a problem of low productivity. Therefore, the batch type capable of achieving mass production is mainly used.

In a batch-type substrate processing apparatus of the related art, a plurality of substrates are stacked in the vertical direction, and processes are performed. From a single wafer type process or other process before a substrate process or from an end effector of a transport module, particles attached on a bottom surface of a substrate may be fallen on a film formation surface of the lower substrate during loading and unloading of the substrates or during the process, so that a quality of the growing films may be deteriorated.

In addition, since the batch-type substrate processing apparatus of the related art has a structure where spaces between the substrates are opened, although a constant amount of the process gas is supplied through spray nozzles corresponding to the substrates, the substrates positioned at the upper and lower sides are influenced, so that the substrate process cannot be uniformly performed on the substrates in the substrate boat.

CITATION LIST

Patent Document

Patent Document 1: Korean Patent No. 10-1313262

SUMMARY OF THE INVENTION

The invention is to provide a substrate processing apparatus where plurality of loading spaces where a plurality of substrates are to be loaded are formed by a plurality of partition plates, so that processes can be performed independently on the substrates.

According to an aspect of the invention, there is provided a substrate processing apparatus including: a substrate boat including a plurality of partition plates formed a plurality of loading spaces where a plurality of substrates are loaded and a plurality of connection rods connecting the partition plates, the plurality of substrates being loaded into the plurality of loading spaces in multiple stages; an internal reaction tube in which a reception space receiving the substrate boat is formed and a process for the substrates loaded in the substrate boat is performed; a gas supply unit supplying a process gas containing a raw material gas and an etching gas to the substrates through spray nozzles; and an exhaust unit emitting process residuals inside the internal reaction tube through suction ports provided corresponding to the spray nozzles, wherein the substrates are loaded to be separated from the partition plates.

The gas supply unit may further include a plurality of auxiliary nozzles which are provided for the respective loading spaces to penetrate the internal reaction tube and are separated from edges of the partition plates.

Each of the connection rods may be provided with a plurality of slots which are coupled with the partition plates.

The connection rods may be arranged symmetrically with respect to a loading direction of the substrates.

The substrate boat may further include a plurality of first support tips which are coupled with edges of the partition plates and support the substrates.

The first support tips may have different height according to the loading spaces.

The substrate boat may further include a plurality of second support tips which are coupled with coupling grooves having different heights formed in each of the connection rods and supports the substrates.

A plurality of the coupling grooves may be disposed to each of the loading spaces, and the second support tips may be coupled with the coupling grooves at different heights according to the loading spaces.

The gas supply unit may supply the process gas independently to each of the loading spaces.

In a substrate processing apparatus according to the embodiment of the invention, a plurality of loading spaces where a plurality of substrates are to be loaded are formed by a plurality of partition plates, so that processes can be performed independently on the substrates which are loaded in the loading spaces in multiple stages. Therefore, from a single wafer type process or other process before a substrate process or from an end effector of a transport module, particles attached on a bottom surface of a substrate can be prevented from being fallen on a film formation surface of the lower substrate during loading and unloading of the substrates or during the process, and an equal amount of the process gas can be supplied to the substrates. Therefore, it is possible to achieve uniform growing films having excellent quality for the substrates. In addition, gases can be independently supplied to the substrates, so that the supply amounts of the gasses can be controlled according to the circumstances of the substrates. Therefore, the process can be performed in optimal conditions for the respective substrates, so that it is possible to improve quality of the growing films. In addition, different process gases can be selectively supplied to respective substrates according to process circumstances, so that various types of growing films can be formed in a single chamber by using a single process.

DETAILED DESCRIPTION OF THE INVENTION

Figure 1:
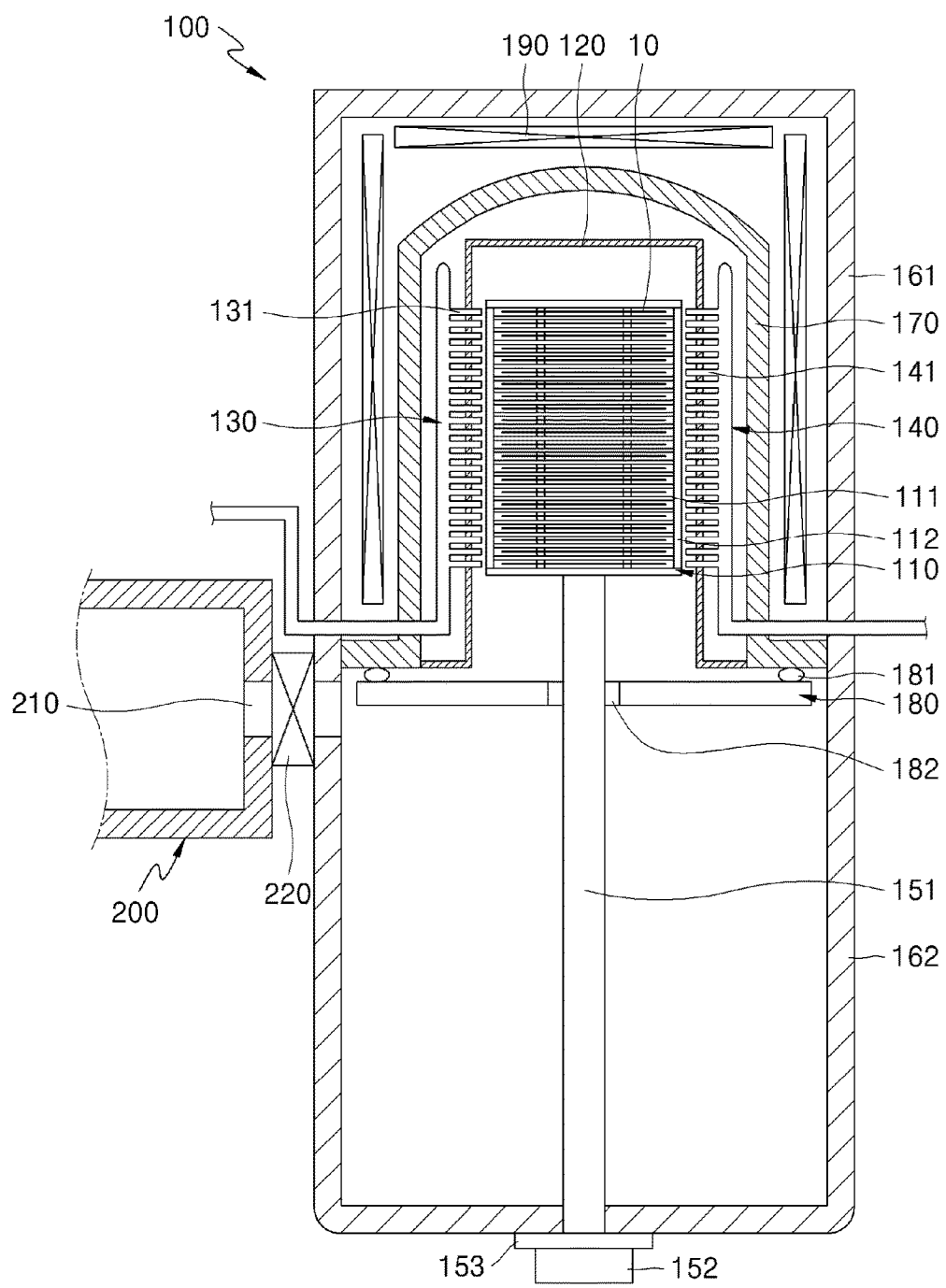
FIG. 1 is a cross-sectional diagram illustrating a substrate-processing apparatus according to an embodiment of the invention.

Hereinafter, embodiments of the invention will be described in detail with reference to the attached drawings. The invention is not limited to the embodiment disclosed below, but it may be implemented in various forms. The embodiments are provided in order to complete the disclosure of the invention and in order for the skilled in the art to have the better understanding of the invention. In this specification, the same components are denoted by the same reference numerals. In the drawings, some portions may be exaggerated in size for the more accurate description, and the same components are denoted by the same reference numerals.

In a selective epitaxial growth (SEG) apparatus, a mixture of a raw material gas and a small amount of an etching gas is supplied, so that a deposition reaction together with an etching reaction is performed on a substrate. The deposition reaction and the etching reaction simultaneously occur with relatively difference reaction rates with respect to a polycrystalline layer and an epi-layer. In a deposition process, while an existing polycrystalline layer or amorphous layer is deposited on at least one secondary layer, an epi-layer is formed on a monocrystalline surface. However, the deposited polycrystalline layer is generally etched at a rate higher than the epi-layer. Therefore, by changing a concentration of the etching gas, a net selective process leads to deposition of an epitaxy material and deposition of a limited or unlimited polycrystalline material. For example, in the SEG apparatus, an epi-layer of a silicon-containing material can be formed on a monocrystalline silicon surface while a deposition material does not remain on a spacer.

A substrate processing apparatus 100 according to the embodiment of the invention may be such an SEG apparatus.

FIG. 1 is a cross-sectional diagram illustrating the substrate processing apparatus according to the embodiment of the invention.

Referring to FIG. 1, the substrate processing apparatus 100 according to the embodiment of the invention is configured to include a substrate boat 110 including a plurality of partition plates 111 forming a plurality of loading spaces where a plurality of substrates 10 are loaded and a plurality of connection rods 112 connecting the partition plates 111 to allow the substrates 10 to be loaded in the loading spaces in multiple stages; an internal reaction tube 120 in which a reception space receiving the substrate boat 110 is formed and a process for the substrates 10 loaded in the substrate boat 110 is performed; a gas supply unit 130 supplying a process gas containing a raw material gas and an etching gas to the substrates 10 through spray nozzles 131; and an exhaust unit 140 emitting process residuals inside the internal reaction tube 120 through suction ports 141 provided corresponding to the spray nozzles 131.

In the substrate processing apparatus 100 according to the embodiment of the invention, an epi-layer can be formed on the substrate 10. In this case, the substrate processing apparatus 100 may be an SEG apparatus. In general, in substrate processing facility, a transporting process, a cleaning process, and an epitaxial process performed. Since the epitaxial process takes a longer time than the cleaning process, production yield may be improved through a plurality of the substrate processing apparatuses 100. The substrate processing apparatus 100 may perform an epitaxial process. The epitaxial process may be performed through chemical vapor deposition, and an epi-layer is formed on an epitaxy surface. For example, the epitaxy surface on the substrate 10 may be exposed to a process gas containing a silicon gas (for example, $SiCl_4$, $SiHCl_3$, $SiH_2Cl_2$, $SiH_3Cl$, $Si_2H_6$, or $SiH_4$) and a carrier gas (for example, $N_2$ or $H_2$). In the case where dopants are required to be included in the epi-layer, the silicon gas may further contain a dopant-containing gas (for example, $AsH_3$, $PH_3$, or $B_2H_6$).

The substrate boat 110 may load a plurality of the substrates 10 in multiple stages (or in the vertical direction) for performing of processes in a batch type, and the substrate boat 100 may be lifted up and down for the loading or process. For example, the substrate boat 110 may load twenty-two substrates 10 in multiple stages. While the substrate boat 110 is positioned in a loading space (or at a loading position) provided inside a lower chamber 162, the substrates 10 may be loaded in the substrate boat 110. More specifically, in the case where one substrate 10 is loaded in one stage of the substrate boat 110, if the substrate boat 110 is lifted up, with respect to the stage where the substrate 10 is loaded, the next substrate 10 can be loaded in the lower stage. When all the substrates 10 are loaded in the substrate boat 110, the substrate boat 110 may be transported to a reception space (or to a process position) of the internal reaction tube 120, and an epitaxial process may be performed in the reception space of the internal reaction tube 120.

The substrate boat 110 may include the partition plates 111 forming the loading spaces where the respective substrates 10 are loaded and the connection rods 112 connecting the partition plates 111. The partition plates 111 individually form the loading spaces where the respective substrates 10 are loaded, so that the substrates 10 may be individually processed in the respective loading spaces. Namely, the substrate boat 110 is provided with multiple states of the loading spaces in the vertical direction, and one substrate 10 may be loaded in each loading space. Therefore, process areas of the substrates 10 are individually in the respective loading spaces of the substrate boat 110, so that it is possible to preventing a process gas sprayed to each substrate 10 from influencing an upper or or lower substrate 10'. On the other hand, as a material of the partition plate 111, a ceramic, quartz, or a synthetic quartz may be used.

In a batch-type substrate processing apparatus in the related art, in a state that a plurality of substrates are vertically stacked, processes are performed. From a single wafer type processor other process before a substrate process or from an end effector of a transport module, particles attached on a bottom surface of a substrate may be fallen on a film formation surface of the lower substrate during loading and unloading of the substrates or during the process, so that a quality of the growing films may be deteriorated.

However, in the substrate processing apparatus 100 according to the invention, the substrate boat 110 including the partition plates 111 is used to independently separate the substrates 10, so that particles attached on the bottom surface of the substrate 10 can be prevented from being fallen on the lower substrate 10', and thus, a deterioration in quality of the growing films can be prevented.

In addition, since the batch-type substrate processing apparatus of the related art is provided with a single process gas supply line, only the amount of the process gas supplied into the internal reaction tube can be controlled, but the amounts of the process gases supplied to the respective substrates cannot be individually controlled. Namely, the concentrations of the process gasses supplied to the substrates cannot be controlled, and thus, the thickness of the growing films on the substrates cannot be controlled. Accordingly, there is a problem in that the thickness of the growing films varies with the substrates. In addition, in order to solve this problem, although a system including multi-stage gas supply nozzles and gas exhaust outlets is provided to independently supply constant amounts of the process gases to the respective substrate through a plurality of gas supply nozzles (or spray nozzles), since the substrate boat of the related art has a structure where spaces between the substrates are opened, each of the gas supply nozzles influences the substrates positioned at the upper and lower side, so that the substrate process cannot be uniformly performed on the substrates in the substrate boat.

However, in the substrate boat 110 according to the invention, the partition plates 111 are provided between the substrates 10 and the substrates 10', and thus, the substrates 10 are independently separated. Therefore, the process gas sprayed on each substrate 10 is prevented from influencing the upper or lower substrate 10', and thus, the equal amount of the process gas can be supplied to all the substrates 10.

The connection rods 112 can connect the partition plates 111. The connection rods stably support the partition plates 111 so that, during the processes for the substrate 10, the partition plates 111 are not allowed to be slanted and the loading spaces are not allowed to be deformed. In addition, the connection rods 112 enable the components of the substrate boat 110 such as the partition plates 111 to be integrally coupled with each other.

In addition, the connection rods 112 may be arranged symmetrically with respect to a loading direction (or a accessing direction) of the substrates 10. The connection rods 112 may be arranged symmetrically in order to stably support the partition plates 111 and the substrates 10. If the connection rods 112 cover the loading direction of the substrates 10, the connection rods may interfere with the substrates during the loading (or accessing) of the substrates 10, and furthermore, the substrates may not be loaded. Therefore, the auxiliary nozzles may be arranged symmetrically in the loading direction of the substrates 10.

Herein, with respect to the connection rods 112, the distance between the connection rods 112 arranged symmetrically at the positions nearest to an inlet 210 may be larger than the width of the substrate 10. Although the connection rods 112 are arranged symmetrically with respect to the loading direction of the substrates 10, if the distance between the connection rods 112 arranged symmetrically at the positions nearest to the inlet 210 is smaller than the width of the substrate 10, the connection rods interfere with the loading of the substrates 10, so that the substrates 10 may not be loaded. Therefore, the distance between the connection rods 112 arranged symmetrically at the positions nearest to the inlet 210 may be equal to or larger than the width of the substrate 10. If the distance between the connection rods 112 is equal to the width of the substrate 10, the substrates 10 may be hard to load. Accordingly, the distance between the connection rods 112 may be configured to slightly larger than the width of the substrate 10. At this time, in order to configure the distance between the connection rods 112 arranged symmetrically at the positions nearest to the inlet 210 to be larger than the width of the substrate 10, the connection rods 112 need to be arranged to be closer to the portion far from the inlet 210 than the portion near to the inlet 210. Therefore, the connection rods 112 may be arranged to be closer to the portion far from the inlet 210.

In this manner, the connection rods 112 are arranged symmetrically with respect to the loading direction of the substrates 10 so that the distance between the connection rods 112 arranged symmetrically at the positions nearest to the inlet 210 is larger than the width of the substrate 10. Therefore, the connection rods cannot interfere with the substrates 10 during the loading of the substrates 10, so that the substrates 10 can be easily loaded. Since the connection rods 112 are arranged symmetrically, the partition plates 111 and the substrates 10 can be stably supported. In addition, in the case where the process gas is supplied in the loading direction of the substrates 10, since the process gas can flow toward the exhaust unit 140 without interference, a smooth flow of the process gas can be maintained. Therefore, it is possible to effectively form growing films on the substrates 10.

On the other hand, each of the connection rods 112 is provided with a plurality of slots which are coupled with the partition plates 111. In each of the connection rods 112, the slots may be formed in the vertical direction, and the partition plates 111 may be coupled through insertion into the slots. In this case, through such a method of inserting or extracting the partition plate 111 with respect to each slot, the interval (or height) between the partition plates 111 can be easily adjusted.

The heights of the loading spaces partitioned by the partition plates 111 may be different according to the loading spaces. The heights may be different according to the process conditions. At this time, the intervals between the partition plates 111 can be easily adjusted by the slots formed in the connection rods 112. The flow of the process gas may vary with the heights of the respective loading spaces, and the heights of the respective loading spaces may be adjusted according to the supply conditions of the process gas in the loading spaces. For example, in the case where the diameters of the spray nozzles 131 are different, if the diameter of the spray nozzle 131 is increased, the spray angle of the process gas is widened. Therefore, in order not to influence the adjacent loading space, the heights of the respective loading spaces may be adjusted according to the diameters of the spray nozzles 131. At this time, the heights of the loading spaces may be proportional to the diameters of the respective spray nozzles 131.

On the other hand, the ratios (or concentrations) of the raw material gas, the etching gas, the carrier gas, and the dopant gas in the process gas may be different according to the loading spaces (or the positions). If the ratios of the raw material gas, the etching gas, the carrier gas, and the dopant gas are different, the flow of the process gas also varies.

In order to adjust the flow of the process gas according to the ratios of the raw material gas, the etching gas, the carrier gas, and the dopant gas, the heights of the loading spaces partitioned by the partition plates 111 may be adjusted. Therefore, the loading spaces may have different heights.

The internal reaction tube 120 may have a reception space in which the substrate boat 110 can be received, and the processes for the substrates 10 loaded in the substrate boat 110 can be performed therein. The internal reaction tube 120 may be configured in a shape of a cylinder. The top portion of the internal reaction tube may be closed and the bottom portion thereof may be opened. When the substrate boat 110 is lifted up and down in the vertical direction to be positioned in the reception space of the internal reaction tube 120, the substrate boat may be allowed to enter into or to be extracted from the reception space of the internal reaction tube 120 through the opening of the internal reaction tube 120. The bottom portion of the internal reaction tube 120 is provided with a protrusion portion which is protruded outward from the circumference of the internal reaction tube 120 to be connected to an external tube 170 or a chamber 160 so that the protrusion portion can be connected to the external tube 170 or an inner wall of the chamber 160 to be supported.

In addition, the internal reaction tube 120 can provide a substrate process region where the processes for the substrates 10 are to be performed. At the time of switching to the process position, the substrate boat 110 is positioned in the substrate processing region, and thus, the volume of substrate processing region can be reduced. In this case, the consumption amount of the process gas can be minimized, and the process gas can be concentrated on the substrates 10 loaded in the substrate boat 110.

The internal reaction tube 120 may be configured with a ceramic or a quartz or metal coated with a ceramic. The internal reaction tube 120 may be provided with through-holes along the side wall so as to correspond to the spray nozzles 131 and the suction ports 141, and the spray nozzles 131 may be inserted into the through-holes to pass through the through-holes.

The gas supply unit 130 may supply a process gas containing a raw material gas and an etching gas to the substrates 10 through the spray nozzles 131. The spray nozzles 131 may be one spray nozzle which is linearly formed or may be a plurality of spray nozzles which are linearly arranged. In the case where the spray nozzles 131 are a plurality of spray nozzles which are linearly arranged, the spray nozzle 131 is formed for every loading space partitioned by the partition plates 111 (namely, for every space between the partition plates). In this case, since one substrate 10 can be processed by using one spray nozzle 131, a uniform growing film can be formed on each of the substrates 10, and since the process gas can be supplied independently to the substrates 10, the supply amounts of the process gas can be controlled according to the circumstances of the substrates. Therefore, the process can be performed under the conditions optimized to the substrates 10, so that the quality of the growing films can be improved.

The spray nozzles 131 linearly arranged may be arranged in the vertical direction, and the diameter of the spray nozzle 131 may be configured to larger as the spray nozzle is arranged at a farther position from the gas supply source (not shown). For example, in the case where the process gas is supplied from a lower portion to an upper portion through a single gas supply line, the diameters of spray nozzles 131' positioned at the upper side may be configured to be larger than the diameters of spray nozzles 131 positioned at the lower side.

More specifically, in the case where the spray nozzles 131 are arranged near to the gas supply source, since the process gas is supplied from the near position, the process gas is easily flowed in. In the case where the spray nozzles 131' are arranged far from the gas supply source, since the process gas is supplied from the far position, it is difficult to supply the process gas in comparison with the spray nozzles 131 are arranged at the positions near to the gas supply source. Therefore, in the case where the process gas is supplied through a single gas supply line and is distributed by the spray nozzles 131, the spray amount of the process gas sprayed from the lower spray nozzles 131 arranged near to the gas supply source may be different from the spray amount of the process gas sprayed from the upper spray nozzles 131 arranged far from the gas supply source. Therefore, the diameters of the spray nozzles 131 arranged near to the gas supply source may be configured to be small so as to decrease the spray amount of the process gas, and the diameters of the spray nozzles 131' arranged far from the gas supply source may be configured to be large so as to increase the spray amount of the process gas. Namely, the diameters of the spray nozzles 131 may be adjusted so that the spray nozzles 131 arranged near to the gas supply source and the spray nozzles 131' arranged far from the gas supply source can supply a uniform amount of the process gas. Therefore, a uniform amount of the process gas is supplied to the substrates 10 of the loading spaces, so that it is possible to improve process efficiency.

The gas supply unit 130 may supply a process gas containing a raw material gas and an etching gas to the substrates 10 through the spray nozzles 131. The process gas may contain a raw material gas (for example, a silicon gas such as $SiCl_4$, $SiHCl_3$, $SiH_2Cl_2$, $SiH_3Cl$, $Si_2H_6$, or $SiH_4$) and an etching gas. As a raw material gas (or a silicon gas), monosilane ($SiH_4$), dichlorosilane (DCS, $SiH_2Cl_2$), or the like may be used. As an etching gas, hydrochloride (HCl) may be used. The process gas may further contain a carrier gas. The carrier gas can be used to dilute a concentration of the raw material gas or the etching gas. As a carrier gas, at least one of nitrogen ($N_2$) and hydrogen ($H_2$) may be used. Therefore, by controlling supply amount of the carrier gas, the concentration of the raw material gas or the etching gas can be controlled, and the raw material gas, the etching gas, and the carrier gas can be easily mixed due to difference in molecular weight. The process gas is not limited thereto, but the process gas may contain various gases such as a dopant gas. The selective epitaxial growth process is involved with a deposition reaction and an etching reaction. In the case where an epi-layer is required to contain dopants, a dopant gas (for example, $AsH_3$, $PH_3$, or $B_2H_6$) may be contained. In addition, an etching gas containing hydrochloride (HCl) may be used for cleaning as well as etching.

On the other hand, the gas supply unit 130 may supply the different process gases to the respective substrates 10. In general, in a batch-type substrate processing apparatus, the same process gas is supplied to the substrates, and thus, the same substrate process is performed on the substrates 10. However, in the invention, the different process gases may be supplied to the respective substrates 10, so that various types of growing films can be formed in a single chamber by using a single process. Herein, the process gases may be different according to the substrates 10, may be different for only a portion of the substrates 10, and may be different according to groups of the substrates. In addition, the process gases may be supplied through different gas supply lines to the loading spaces of the substrate boat 110. Therefore, the different process gases may be supplied to the substrates 10. In the case where the process gases are different according to the groups of the substrates, the same gas supply line may be according to the same group of the substrates. In case of a plurality of the spray nozzles 131, in order to individually supply gases to the respective loading spaces of the substrate boat 110, the spray nozzles may be configured to have different heights. The spray nozzles 131 being in contact with the lower loading space may be configured to be lower, and the spray nozzles 131' being in contact with the upper loading space may be configured to be higher. For example, the spray nozzles 131 may be arranged in a helical shape along the circumference of the internal reaction tube 120. In this case, the auxiliary nozzles 131 may be arranged in the order of from the lowest auxiliary nozzle 131 to the highest auxiliary nozzle 131' in terms of height. Therefore, in comparison with the case where the auxiliary nozzles 131 having different heights are arranged irregularly, it is possible to improve space efficiency. In addition, if necessary, different process gases may be selectively supplied to the respective substrates 10 through the spray nozzles 131 arranged linearly. Therefore, various types of growing films can be formed in a single chamber by using a single process.

In this manner, the gas supply unit 130 is provided with the spray nozzles 131 for the respective loading spaces of the substrate boat 110, so that the process gas for the respective loading spaces can be individually controlled.

The exhaust unit 140 may emit process residuals inside the internal reaction tube 120 through the suction ports 141 formed corresponding to the spray nozzles 131. The suction ports 141 may be arranged symmetrically with respect to the spray nozzles 131, and the number or shape of the suction ports 141 may be the same as the number of shape of the spray nozzles 131. The process residuals inside the internal reaction tube 120 which are emitted by exhaust unit 140 may contain unreacted gases and by-product of the reactions. In the case where a plurality of the spray nozzles 131 are provided, a plurality of the suction ports 141 are also provided. If the suction ports 141 are positioned symmetrically with respect to the spray nozzles 131, the process residuals containing the unreacted gases and the by-product of the reactions can be effectively emitted, and the flow of the process gas can be effectively controlled. Namely, by adjusting an exhaustion speed (or exhaustion strength), a growing rate of the film growing on the substrate 10 can be controlled. In the case where a plurality of the suction ports 141 are provided, similarly to a plurality of the spray nozzles 131, the suction ports may be arranged to have different heights, and each of the suction ports 141 may have a slot-shaped cross section in order to achieve the effective suction.

On the other hand, the internal reaction tube 120 may be provided with a support member (not shown) which is provided around the internal reaction tube 120 so as to stably support the gas supply line and the exhaust line. The support member may have a shape of a ring for supporting the gas supply line and the exhaust line. The structure and shape of the internal reaction tube 120 are not limited thereto, but various structure and shapes may be employed.

Figure 2:
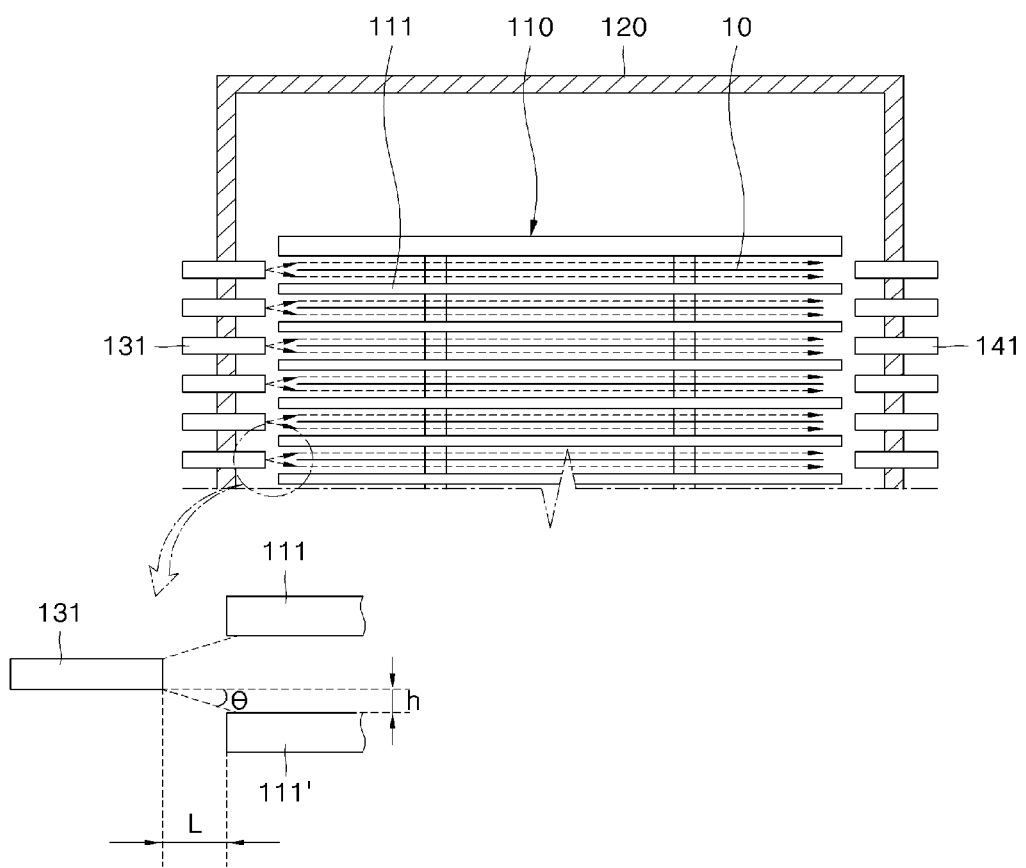
FIG. 2 is a conceptual diagram illustrating a flow of a process gas by a substrate boat according to the embodiment of the invention.

FIG. 2 is a conceptual diagram illustrating the flow of the process gas by the substrate boat according to the embodiment of the invention.

Referring to FIG. 2, the substrates 10 may be loaded so as to be separated from the partition plates 111. In this case, a flow of the process gas can be induced to upper surfaces of the substrate 10, and the process gas can uniformly pass through the entire areas of the substrates 10. However, if lower surfaces of the substrates 10 are in close contact with the bottom surfaces (that is, the partition plates), in the case where the upper surfaces of the substrates 10 are positioned lower than the spray nozzles 131, due to the suction ports 141, a large amount of the process gas is exhausted without passing through the upper surfaces of the substrates 10, and due to a difference in height between the upper surfaces of the substrates 10 and the spray nozzles 131, a large amount of the process gas may reach only the two side portions or central portions of the substrates 10 according to a spray speed (or spray strength), so that it may be difficult to uniformly supply the process gas to the entire areas. In addition, even in the case where the spray nozzle 131 and the upper surface of the substrate 10 are allowed to be equalized in height, the bottom surface (that is, the partition plate) may interfere with the process gas, and thus, the flow of the gas is induced to only the upper portion, so that a large amount of the process gas may reach only the area of the substrate 10 near to the spray nozzle 131.

In the invention, since each of the substrates 10 is separated from the partition plates 111, if the process gas is sprayed in the state that each of the substrates 10 is positioned at the center between the spray nozzle 131 and the suction port 141, the flow of the process gas is effectively induced to the upper and lower portions of the substrate, so that the process gas can uniformly pass through the entire area of the substrate 10. Namely, since the flow of the process gas pass through the upper and lower portions of the substrate 10, a laminar flow occurs, so that a growing film is uniformly formed over the entire area of the substrate 10.

Herein, the heights (that is, intervals between the partition plates) of the loading spaces partitioned by the partition plates 111 and the distances between the substrates 10 and the partition plates 111 are important factors for occurrence of a laminar flow. According to ratios of the raw material gas, the etching gas, the carrier gas, and the dopant gas, the molecular weight (or mass, flow rate, concentration) of the process gas is different, so that the flow of the process gas varies. Therefore, in order to improve a degree of uniformity over the entire area of the substrate 10 by adjusting the flow of the process gas according to ratios of the raw material gas, the etching gas, the carrier gas, and the dopant gas, the heights of the loading spaces partitioned by the partition plates 111 can be adjusted to be the above-described heights of the loading spaces for occurrence of the laminar flow. In addition, since the flow of the process gas is influenced by the distance between the substrate 10 and the partition plate 111, in order to solve this problem, the distance between the substrate 10 and the partition plate 111 may be adjusted. The detailed method of adjusting the distance between the substrate 10 and the partition plate 111 will be described with reference to FIG. 3 and FIG. 4. Therefore, the heights of the loading spaces may be different, and the distances between the substrate 10 and the partition plate 111 may also be different.

On the other hand, in the case where the substrates 10 are separated from the partition plates 111, epi-layers can be formed on all the upper and lower surfaces of the substrates 10.

The gas supply unit 130 may be configured to further include auxiliary nozzles (not shown) which are provided for the respective loading spaces partitioned by the partition plates 111 to penetrate the internal reaction tube 120 and are separated from edges of the partition plates 111. In the substrate processes, the auxiliary nozzles can supply an auxiliary gas to the loading spaces partitioned by the partition plates 111 and can supply a gas different from the process gas. Each of the auxiliary nozzles may supply at least one of a dopant gas, a carrier gas, and an etching gas. The dopant gas can be used in a mixture with a raw material gas (for example, a silicon gas) to deposit a film on the substrate 10, and the carrier gas can be used to dilute a concentration of the raw material gas or the etching gas. Therefore, by controlling concentrations of the dopant gases in the respective loading spaces where the substrates 10 are processed, doping concentrations of growing films (for example, silicon films) can be individually controlled. In addition, by controlling supply amounts of the carrier gases supplied to the respective loading space, concentrations of the raw material gas and concentrations of the etching gas for the respective loading spaces can be individually controlled. Therefore, by selectively using the dopant gas, the carrier gas, and the etching gas through the auxiliary nozzles, the substrate processes can be selected for the respective loading spaces. Namely, in case of supplying only an etching gas through the auxiliary nozzles, a mixing ratio of the etching gas in loading spaces is increased, so that an etching process can be performed so as to enable selective epitaxial growth on the substrates 10. In addition, in case of supplying only a dopant gas through the auxiliary nozzles, a mixing ratio of the dopant gas in the loading spaces is increased, so that films can be formed on the substrates 10 by a mixture of the raw material gas and the dopant gas. In addition, due to difference in distance from the gas supply source, different amounts of the process gas are supplied to the respective loading spaces, so that the loading spaces can be controlled to have the same components and molecular weights of the process gas.

More specifically, in the selective epitaxial growth, in the case where only the etching gas is supplied or only the etching gas and the carrier gas are supplied, the gas supplied through the auxiliary nozzle is mixed with the process gas, so that the ratio of the etching gas in the loading space is increased. Accordingly, in a portion where a film on the substrate 10 is to be formed slowly, before the film is grown, the film may be removed by the etching gas. On the contrary, in a portion where a film on the substrate 10 is to be formed fast, before the film is removed by the etching gas, the film may be deposited to be grown. In this manner, by controlling the concentration of the etching gas through the auxiliary nozzles, a selective epitaxial process may be performed.

On the other hand, if the gas supply through the auxiliary nozzles is stopped, by the supply of the process gas through the spray nozzles 131, films (for example, silicon films) may be formed on the substrates 10 in the loading spaces. In addition, different gases may be supplied through different gas supply lines to the respective auxiliary nozzles. Therefore, the dopant gas, the carrier gas, or the etching gas may be selectively supplied to each of the loading spaces. In addition, in order to individually supply gases to the respective loading spaces of the substrate boat 110, the auxiliary nozzles may be configured to have different heights. For example, the auxiliary nozzle being in contact with the lower loading space may be configured to be lower, and the auxiliary nozzle being in contact with the upper loading space may be configured to be higher. For example, the auxiliary nozzles may be arranged in a helical shape along the circumference of the internal reaction tube 120. In this case, the auxiliary nozzles may be arranged in the order of from the lowest auxiliary nozzle to the highest auxiliary nozzle in terms of height. Therefore, in comparison with the case where the auxiliary nozzles having different heights are arranged irregularly, it is possible to improve space efficiency.

In addition, the auxiliary nozzles (not shown) may be configured to penetrate the side wall of the internal reaction tube 120. In this case, since the gas can be sprayed through the auxiliary nozzles from the sites near to the loading spaces of the substrate boat 110, the loading spaces adjacent to the top or bottom portion can be effectively prevented from interfering with the gas sprayed through the auxiliary nozzles, and the flow of the supplied gas can be effectively controlled by the auxiliary nozzles.

In addition, the auxiliary nozzles (not shown) may be configured to be separated from edges of the partition plates 111. In order to completely prevent the adjacent loading spaces from interfering with the gas sprayed through the auxiliary nozzles, it is most preferable that the auxiliary nozzles spray the gas inside the loading spaces of the substrate boat 110. However, in this case, since the auxiliary nozzles may interfere with the substrate boat 110 and the partition plates 111 during the lifting of the substrate boat 110, the auxiliary nozzles may be separated from the edges of the partition plates 111. Herein, a separation distance L may be defined as a minimum distance so that the auxiliary nozzles cannot interfere with the substrate boat 110 during the lifting of the substrate boat 110. The separation distance L may be obtained by using a difference in height between the auxiliary nozzle and the partition plate 111, a spray angle θ, and the like. In addition, similarly to the auxiliary nozzles, the spray nozzles 131 may also be separated from the edges of the partition plates 111.

The gas supply unit can supply the process gas independently to the loading spaces. The process gas may contain a carrier gas and a dopant gas as well as the raw material gas and the etching gas. Different amount of the raw material gas, the etching gas, the carrier gas, and the dopant gas may be supplied to the respective loading spaces. At this time, naturally different amounts may be supplied to the loading spaces, and intentionally different amounts may be supplied to the loading spaces. For example, in case of supplying the process gas through a single gas supply line, due to a difference in flow rate between the spray nozzle 131 near to the gas supply source and the spray nozzle 131' far from the gas supply source, different amounts may be supplied to the loading spaces. Different amounts of the raw material gas, the etching gas, the carrier gas, and the dopant gas can be independently supplied through the auxiliary nozzles to the loading spaces. In the invention, with respect to an irregular gas flow caused by a difference in amount of the raw material gas, the etching gas, the carrier gas, and the dopant gas, by adjusting the heights of the loading spaces, the gas flow can be uniform over the entire areas of the substrates 10. Therefore, it is possible to solve the problem of an irregular gas flow caused by a natural difference in amount of the raw material gas, the etching gas, the carrier gas, and the dopant gas, and in the case where the amounts of the raw material gas, the etching gas, the carrier gas, and the dopant gas are intentionally set to be different, the gas flow can be uniform over the entire areas of the substrates 10. Therefore, the processes for the substrate 10 can be performed in accordance with the respective process conditions, so that it is possible to effectively form various types of the growing films by a single substrate process performed in a single chamber. On the other hand, insufficient amounts of the gases for each loading space is supplied through the auxiliary nozzles, the amounts of the raw material gas, the etching gas, the carrier gas, and the dopant gas can be equal for the loading spaces.

A shaft 151 may be connected to the bottom of the substrate boat 110. The shaft 151 may be formed to extend in the vertical direction, and the upper end thereof is connected to the bottom portion of the substrate boat 110. The shaft 151 has a function of supporting the substrate boat 110, and the lower portion of the shaft 151 may penetrate the lower chamber 162 to be connected to a lifting drive unit 152 and a rotation drive unit 153 outside the lower chamber 162.

The lifting drive unit 152 is connected to the shaft 151 to lift up and down the shaft 151, and thus, the substrate boat 110 connected to the upper end of the shaft 151 can be lifted up and down according to the lifting up and down of the shaft 151. For example, by the operation of the lifting drive unit 152, the substrate boat 110 is moved down to be positioned inside the lower chamber 162 (or at the loading position), and the substrates 10 loaded from the transport chamber 200 into the lower chamber 162 can be loaded in the substrate boat 110 positioned inside the lower chamber 162. After that, if all the substrates 10 are loaded in the substrate boat 110, the substrate boat 110 is moved upward by the lifting drive unit 152 to be moved into the reception space (or to the process position) of the internal reaction tube 120. Therefore, the epitaxial process can be performed on the substrate 10 in the reception space of the internal reaction tube 120.

The rotation drive unit 153 may be connected to the shaft 151 connected to the substrate boat 110 so as to rotate the substrate boat 110. The rotation drive unit 153 can rotate the shaft 151 around a central axis in the vertical direction of the shaft 151. Therefore, the substrate boat 110 connected to the shaft 151 can also be rotated in the central axis in the vertical direction. When processes for the substrates 10 is performed, the process gas supplied to the one side of the internal reaction tube 120 can pass through the substrates 10 loaded in the substrate boat 110 to be exhausted from the other side of the internal reaction tube 120. At this time, if the substrate boat 110 is rotated by the operation of the rotation drive unit 153, the gases to pass through the substrate boat 110 are mixed, and thus, the process gas can be distributed uniformly over the entire areas on the substrates 10. Therefore, quality of films deposed on the substrates 10 can be improved. The chamber 160 may be formed in a shape of a rectangular box or a cylinder and have an inner space. In addition, the chamber 160 may include an upper chamber 161 and a lower chamber 162, and the upper chamber 161 and the lower chamber 162 may communicate with each other. The one side of the lower chamber 162 may be provided with an insertion opening which communicates with the transport chamber 200. Through the insertion opening, the substrates 10 can be loaded from the transport chamber 200 into the chamber 160. The one side of the transport chamber 200 corresponding to the insertion opening of the chamber 160 may be provided with an inlet 210. A gate value 220 may be provided between the inlet 210 and the insertion opening. Therefore, the inner space of the transport chamber 200 and the inner space of the chamber 160 may be separated from each other by the gate valve 220. In addition, the inlet 210 and the insertion opening can be opened and closed by the gate valve 220. In this case, the insertion opening may be provided to the lower chamber 162.

The external tube 170 may be arranged to the upper side of the lower chamber 162 of which bottom portion is opened or to the upper chamber 161 and may be positioned between the chamber 160 and the internal reaction tube 120. The external tube 170 may include an inner space where the internal reaction tube 120 where the epitaxial process or the selective epitaxial process is to be performed is received, and the bottom portion thereof is opened.

A support plate 180 may be installed to the shaft 151. The support plate has a function of lifting together with the substrate boat 110 to seal the process space inside the internal reaction tube 120 or the external tube 170 from the outside. The support plate 180 may be arranged to be separated from the lower side of the substrate boat 110. A sealing member 181 having a shape of an O-ring is proved between the support plate 180 and the internal reaction tube 120 or between the support plate 180 and the external tube 170 to seal the process space. In addition, a bearing member 182 may be provided between the support plate 180 and the shaft 151. Therefore, the shaft 151 can be rotated in the state that the shaft is supported by the bearing member 182.

A heater 190 may be provided inside the chamber 160. The heater may be arranged so as to surround the side surface or the top portion of the internal reaction tube 120 or the external tube 170. The heater 190 has a function of supplying heat energy to the internal reaction tube 120 or the external tube 170 to heat the inner space of the internal reaction tube 120 or the external tube 170 and to adjust the temperature of the inner space of the internal reaction tube 120 or the external tube 170 to be a temperature where the epitaxial process can be performed.

Figure 3:
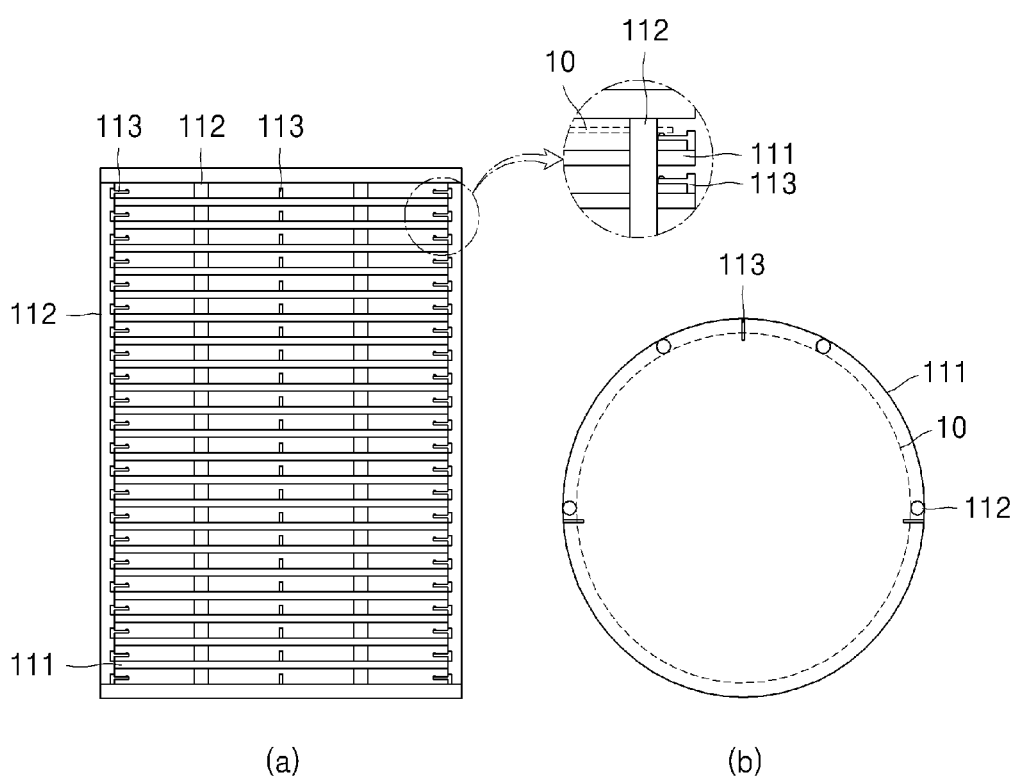
FIG. 3 is a diagram illustrating a substrate boat including first support tips according to the embodiment of the invention.

FIG. 3 is a diagram illustrating a substrate boat including first support tips according to the embodiment of the invention, (a) of FIG. 3 is a cross-sectional diagram of the substrate boat, and (b) of FIG. 3 is a plan diagram of the substrate boat.

Referring to FIG. 3, the substrate boat 110 may be configured to further include first support tips 113 which are coupled with edges of the partition plates 111 and support the substrates 10. Each of the first support tips 113 may be configured with a vertical column portion and a horizontal support portion. One side of the vertical column portion may be coupled with the partition plate 111, and the other side thereof may be connected to the horizontal support portion. The horizontal support portion may be formed so that horizontal support portion is bent at the other side of the vertical column portion or may be formed so that the center thereof is supported by the vertical column portion. Therefore, the substrates 10 can be stably supported, and the substrates 10 can be separated from the partition plates 111. In addition, the first support tips 113 may be formed symmetrically. In this case, the substrates 10 can be more stably supported.

The first support tips 113 may have different heights according to the loading spaces. The first support tips 113 may be formed in two or more shapes having different heights. At this time, the first support tips 113 are speared from the partition plates 111, and the first support tips 113' having different shapes are coupled, so that the heights can be changed. In addition, the partition plates are replaced with the partition plates 111 with which the first support tips 113' in shapes having different heights are coupled, so that the heights can be changed. Namely, the first support tips 113 may be formed in various shapes having different heights, and the first support tips may be changed with the first support tips 113 having different heights according to the process conditions. At this time, all the heights of the first support tips 113 coupled with the same partition plate 111 may be equal to each other. The thickness and shape of the growing film may be different according to the height (or the position of the substrate) of the first support tip 113. The height of the first support tip in accordance with the process can be determined through experiments. Different amounts of the raw material gas, the etching gas, the carrier gas, and the dopant gas may be supplied to the respective loading spaces. In this case, the first support tips 113 may have different heights according to the positions of the loading spaces. In addition, the second support tips 113 may have different heights according to the process conditions for the loading spaces. On the other hand, the first support tips 113 may be installed to be changed according to the thickness or shape of the substrates 10. More specifically, the first support tips 113 may be installed to be changed with different heights according to the thickness of the substrates 10. In addition, the first support tips 113 may be installed at support positions changed according to the shape of the substrates 10. In addition, the flow of the process gas may be controlled by adjusting the distance between the substrate 10 and the partition plate 111.

In addition, a distal end of each first support tip 113 is provided with a spot-shaped protrusion, so that the substrate 10 can be prevented from being attached with the first support tip 113 during the process.

Figure 4:
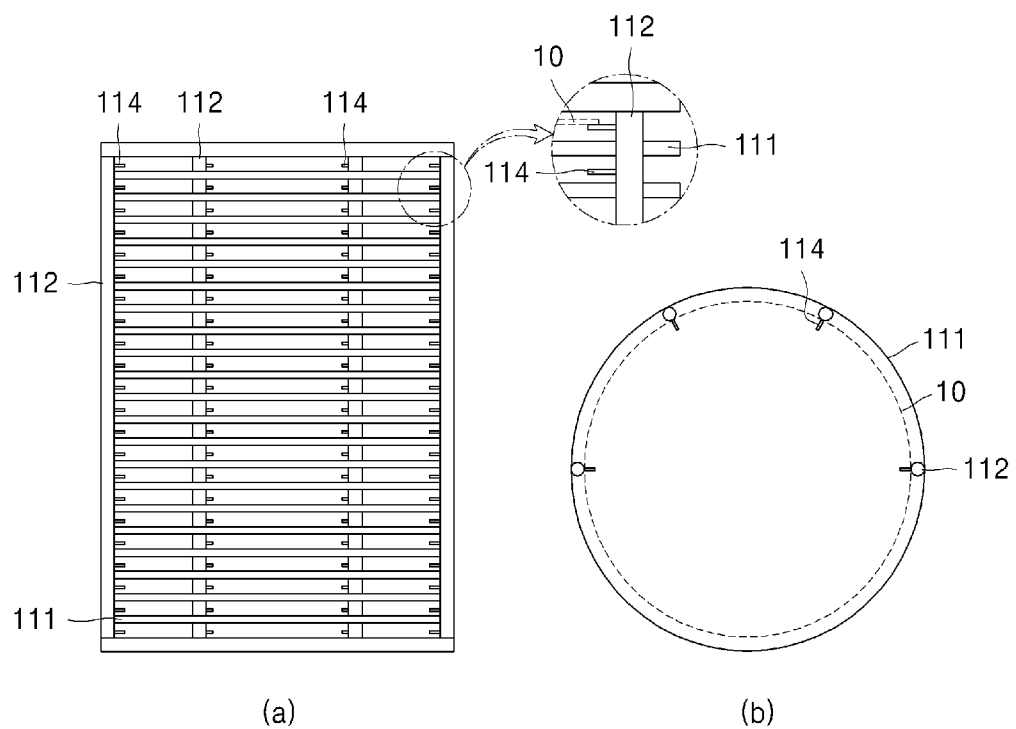
FIG. 4 is a diagram illustrating a substrate boat including second support tips according to the embodiment of the invention.

FIG. 4 is a diagram illustrating a substrate boat including second support tips according to the embodiment of the invention, (a) of FIG. 4 is a cross-sectional diagram of the substrate boat, and (b) of FIG. 4 is a plan diagram of the substrate boat.

Referring to FIG. 4, the substrate boat 110 may be configured to further include second support tips 114 which are coupled with a plurality of coupling grooves having different heights formed in the connection rods 112 and support the substrates 10. Each of the second support tips 114 is formed in a shape of "—" or the like so as to stably support the substrate 10 and to separate the substrate 10 from the partition plates 111. In addition, the second support tips 114 may be formed to protrude in different directions according to the positions of the connection rods 112. In this case, the substrates 10 can be more stably supported.

A plurality of the coupling grooves are positioned for each of the loading spaces partitioned by the partition plates 111, and the second support tips 114 may be coupled with the coupling grooves with different heights according to the loading spaces. In order to adjust the distance between the substrate 10 and the partition plate 111, the height of the second support tip 114 may be adjusted. By such a simple method of coupling the second support tips 114 with the coupling grooves having different heights formed in the vertical direction, the heights of the second support tips 114 can be adjusted. The connection rods 112 may be provided with the coupling grooves with different heights in the vertical direction for the respective loading spaces of the substrate boat 110. At this time, the coupling grooves may be formed at a constant interval, and if necessary, the intervals between the coupling grooves may be different. Each of the second support tips 114 may be configured with an insertion portion which is inserted into the coupling groove and a support portion which supports the substrate 10. The thickness and shape of the growing film may be different according to the height (or the position of the substrate) of the second support tip 114 as well as the height of the first support tip. The height of the second support tip in accordance with the process can be determined through experiments. Different amounts of the raw material gas, the etching gas, the carrier gas, and the dopant gas may be supplied to the respective loading spaces. In this case, the second support tips 114 may have different heights according to the positions of the loading spaces. In addition, the second support tips 114 may have different heights according to the process conditions for the loading spaces. In addition, by adjusting the distance between the substrate 10 and the partition plate 111, the flow of the process gas can be controlled.

On the other hand, the first support tips 113 and the second support tips 114 may be used simultaneously. In this case, the first support tips 113 are formed in portions where the second support tips 114 are hard to form, so that the substrate 10 can be more stably supported. In the substrate loading side, the connection rods 112 cannot be arranged so as not to interfere with the loading of the substrates 10, and the second support tips 114 formed in the connection rods 112 cannot also be arranged in the side where the substrates 10 are loaded. Therefore, the first support tips 113 are arranged in the substrate loading side where the second support tips 114 cannot be arranged, so that the support tips (113 or 114) can stably support the substrates 10 without being biased to one side. At this time, since upper spaces where the substrate 10 can be loaded and unloaded are provided, unlike the connection rods 112, the first support tips 113 can be arranged in the substrate loading side. However, if a too large number of the first support tips 113 are arranged in the substrate loading side, since the flow of the process gas is influenced, the number of first support tips 113 may be minimized.

In the invention, a plurality of loading spaces where a plurality of substrates are to be loaded are formed by a plurality of partition plates, so that processes can be performed independently on the substrates which are loaded in the loading spaces in multiple stages. Therefore, from a single wafer type process or other process before a substrate process or from an end effector of a transport module, particles attached on a bottom surface of a substrate can be prevented from being fallen on a film formation surface of the lower substrate during loading and unloading of the substrates or during the process, and an equal amount of the process gas can be supplied to the substrates. Therefore, it is possible to achieve uniform growing films having excellent quality for the substrates. In addition, gases can be independently supplied to the substrates, so that the supply amounts of the gasses can be controlled according to the circumstances of the substrates. Therefore, the process can be performed in optimal conditions for the respective substrates, so that it is possible to improve quality of the growing films. In addition, different process gases can be selectively supplied to respective substrates according to process circumstances, so that various types of the growing films can be formed in a single chamber by using a single process.

While the present invention has been particularly shown and described with reference to exemplary embodiments thereof, it will be understood by those skilled in the art that various changes in form and details may be made therein without departing from the spirit and scope of the present invention as defined by the appended claims.

LIST OF REFERENCE NUMERALS

10 Substrate
100 Substrate processing apparatus
110 Substrate boat
111 Partition plate
112 Connection rods
113 First support tip
114 Second support tip
120 Internal reaction tube
130 Gas supply unit
131 Spray nozzle
140 Exhaust unit
141 Suction ports
151 Shaft
152 Lifting drive unit
153 Rotation drive unit
160 Chamber
161 Upper chamber
162 Lower chamber
170 External tube
180 Support plate
181 Sealing member
182 Bearing member
190 Heater
200 Transport chamber
210 Inlet
220 Gate valve

What is claimed is:

1. A substrate processing apparatus comprising:
a substrate boat including a plurality of partition plates forming a plurality of loading spaces where a plurality of substrates are loaded and a plurality of connection rods connecting the partition plates, the respective substrates being loaded into the respective loading spaces;
an internal reaction tube in which a reception space receiving the substrate boat is formed and a process for the substrates loaded in the substrate boat is performed;
a gas supply unit supplying a process gas containing a raw material gas and an etching gas to the substrates through a plurality of spray nozzles, which are provided in the respective loading spaces; and
an exhaust unit for exhausting process residuals inside the internal reaction tube through suction ports provided corresponding to the spray nozzles,
wherein the substrates are loaded to be separated from the partition plates during performing the process for the substrates,
wherein the gas supply unit further comprises a plurality of auxiliary nozzles individually supplying an auxiliary gas to the respective loading spaces,
wherein each of the plurality of auxiliary nozzles provided for the respective loading spaces is supplied with the auxiliary gas through respective gas supply lines, which are different from each other and
wherein the auxiliary gas is at least one selected from a dopant gas, a carrier gas, and the etching gas.

2. The substrate processing apparatus according to claim 1, wherein the unit further includes a plurality of auxiliary nozzles penetrate the internal reaction tube and are separated from edges of the partition plates.

3. The substrate processing apparatus according to claim 1, wherein each of the connection rods is provided with a plurality of slots which are coupled with the partition plates.

4. The substrate processing apparatus according to claim 1, wherein the connection rods are arranged symmetrically with respect to a loading direction of the substrates.

5. The substrate processing apparatus according to claim 1, wherein the substrate boat further includes a plurality of first support tips which are coupled with edges of the partition plates and support the substrates.

6. The substrate processing apparatus according to claim 1, wherein the gas supply unit supplies the process gas independently to each of the loading spaces.

7. A substrate processing apparatus comprising:
a substrate boat including a plurality of partition plates forming a plurality of loading spaces where a plurality of substrates are loaded and a plurality of connection rods connecting the partition plates, the respective substrates being loaded into the respective loading spaces;
an internal reaction tube in which a reception space receiving the substrate boat is formed and a process for the substrates loaded in the substrate boat is performed;
a gas supply unit supplying a process gas containing a raw material gas and an etching gas to the substrates through a plurality of spray nozzles, which are provided in the respective loading spaces; and
an exhaust unit for exhausting process residuals inside the internal reaction tube through suction ports provided corresponding to the spray nozzles,
wherein the substrates are loaded to be separated from the partition plates during performing the process for the substrates,
wherein the gas supply unit further comprises a plurality of auxiliary nozzles individually supplying an auxiliary gas to the respective loading spaces,
wherein each of the plurality of auxiliary nozzles provided for the respective loading spaces is supplied with the auxiliary gas through respective gas supply lines, which are different from each other, and
wherein the auxiliary gas is at least one selected from a dopant gas, a carrier gas, and the etching gas,
wherein the substrate boat further includes a plurality of first support tips which are coupled with edges of the partition plates and support the substrates,
wherein each of the first support tips is configured to be installed with various heights respectively determined according to each of the loading spaces.

8. The substrate processing apparatus according to claim 7, wherein the plurality of auxiliary nozzles penetrate the internal reaction tube and are separated from edges of the partition plates.

9. The substrate processing apparatus according to claim 7, wherein each of the connection rods is provided with a plurality of slots which are coupled with the partition plates.

10. The substrate processing apparatus according to claim 7, wherein the connection rods are arranged symmetrically with respect to a loading direction of the substrates.

11. The substrate processing apparatus according to claim 7, wherein the gas supply unit supplies the process gas independently to each of the loading spaces.

* * * * *